US010623674B2

(12) United States Patent
Yamasaki et al.

(10) Patent No.: US 10,623,674 B2
(45) Date of Patent: Apr. 14, 2020

(54) IMAGE PROCESSING DEVICE, IMAGE PROCESSING METHOD AND COMPUTER READABLE RECORDING MEDIUM

(71) Applicant: OLYMPUS CORPORATION, Tokyo (JP)

(72) Inventors: Teruaki Yamasaki, Hino (JP); Manabu Ichikawa, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 19 days.

(21) Appl. No.: 16/034,631

(22) Filed: Jul. 13, 2018

(65) Prior Publication Data

US 2018/0338100 A1  Nov. 22, 2018

Related U.S. Application Data

(63) Continuation of application No. PCT/JP2016/052050, filed on Jan. 25, 2016.

(51) Int. Cl.
*H04N 5/367* (2011.01)
*H04N 5/3745* (2011.01)
(Continued)

(52) U.S. Cl.
CPC ....... *H04N 5/367* (2013.01); *H01L 27/14636* (2013.01); *H01L 27/14643* (2013.01);
(Continued)

(58) Field of Classification Search
CPC ......... H04N 5/357; H04N 5/361–3658; H04N 5/367; H04N 5/3675; H04N 5/37457
See application file for complete search history.

(56) References Cited

U.S. PATENT DOCUMENTS

2002/0012477 A1  1/2002  Inoue
2013/0128082 A1  5/2013  Kiyosawa et al.
(Continued)

FOREIGN PATENT DOCUMENTS

| JP | 2002112992 A | 4/2002 |
| JP | 2006148230 A | 6/2006 |
| JP | 2012044452 A | 3/2012 |
| JP | 2015213257 A | 11/2015 |

OTHER PUBLICATIONS

International Search Report dated Mar. 22, 2016 issued in PCT/JP2016/052050.

*Primary Examiner* — Paul M Berardesca
(74) *Attorney, Agent, or Firm* — Scully, Scott, Murphy & Presser, P.C.

(57) ABSTRACT

An image processing device includes: an acquisition unit configured to acquire image data generated by an imaging element including sharing blocks, each including multiple adjacent pixels configured to generate signals according to amounts of light received externally and one read circuit; an offset calculator configured to, based on the acquired image data and using pixel values of pixels in a sharing block of interest that is one of the multiple sharing blocks and pixel values of pixels outside the sharing block of interest, detect an offset component of a pixel value occurring in the sharing block of interest; and a corrector configured to calculate a correction amount to correct a pixel value of at least one pixel in the sharing block of interest based on the offset component and use the correction amount to correct a pixel value of at least one pixel in the sharing block of interest.

16 Claims, 13 Drawing Sheets

(51) Int. Cl.

| | | |
|---|---|---|
| *H04N 5/77* | (2006.01) | |
| *H04N 5/217* | (2011.01) | |
| *H01L 27/146* | (2006.01) | |
| *H04N 5/14* | (2006.01) | |
| *G06T 5/20* | (2006.01) | |
| *H04N 5/232* | (2006.01) | |
| *H04N 5/378* | (2011.01) | |
| *H04N 5/937* | (2006.01) | |

(52) U.S. Cl.
CPC ........... *H04N 5/142* (2013.01); *H04N 5/2176* (2013.01); *H04N 5/3675* (2013.01); *H04N 5/3745* (2013.01); *H04N 5/37457* (2013.01); *H04N 5/772* (2013.01); *G06T 5/20* (2013.01); *H04N 5/2178* (2013.01); *H04N 5/23241* (2013.01); *H04N 5/378* (2013.01); *H04N 5/937* (2013.01)

(56) References Cited

U.S. PATENT DOCUMENTS

| | | | |
|---|---|---|---|
| 2015/0271423 A1 | 9/2015 | Kiyosawa et al. | |
| 2017/0041565 A1 | 2/2017 | Kondo | |
| 2017/0295329 A1* | 10/2017 | Ichikawa | ............... H04N 1/409 |
| 2017/0302867 A1* | 10/2017 | Ichikawa | ............... H04N 1/409 |
| 2018/0007293 A1* | 1/2018 | Maruyama | ............. H04N 1/409 |
| 2018/0020174 A1* | 1/2018 | Maruyama | ............... H04N 5/21 |
| 2018/0115728 A1* | 4/2018 | Maruyama | ............. H04N 5/378 |

* cited by examiner

ABLE RECORDING MEDIUM

IMAGE PROCESSING DEVICE, IMAGE PROCESSING METHOD AND COMPUTER READABLE RECORDING MEDIUM

CROSS-REFERENCE TO RELATED APPLICATION

This application is a continuation of International Application No. PCT/JP2016/052050, filed on Jan. 25, 2016, the entire contents of which are incorporated herein by reference.

BACKGROUND

The present disclosure relates to an image processing device, an image processing method and a computer readable recording medium.

In recent years, pixels and read circuits to read signals from the pixels in imaging elements, such as complementary metal oxide semiconductors (CMOS), are diminishing in size. Such diminishing has a problem of decrease in sensitivity and increase of various noises. To deal with the decrease in sensitivity, a sharing pixel structure for sharing a single read circuit among pixels to regard the multiple pixels as a single sharing block and read signals is used to reduce the area of the read circuit and increase the aperture ratio of each pixel (ratio of light receivers), thereby increasing the sensitivity.

On the other hand, noises that occur in imaging elements include dark current shot noises due to dark currents and random noises resulting from thermal noises, etc., in a read circuit. In addition to the dark current shot noises and random noises, there are noises in which the pixel values keep representing abnormal values and blinking failure noises in which the pixel values vary at each shot.

There is thus a technology to detect defective pixels in which such noises occur. According to the technology, difference values each between the pixel value of a pixel of interest and the pixel value of a pixel around the pixel of interest and in the same color as that of the pixel of interest are calculated. The difference values and a threshold are used to determine whether the pixel of interest is a defective pixel. When it is provisionally determined that the pixel of interest is a defective pixel, difference values each between the pixel values of adjacent pixels each around the pixel of interest and in a color different from that of the pixel of interest are calculated. The larger the number of adjacent pixels each in a color different from that of the pixel of interest and having difference values exceeding the threshold is, the more a defective condition variable representing a possibility that the pixel of interest may be a defective pixel is reduced to detect defective pixels accurately (see Japanese Laid-open Patent Publication No. 2006-148230).

SUMMARY

An image processing device according to one aspect of the present disclosure includes: an acquisition unit configured to acquire image data generated by an imaging element including sharing blocks arranged two-dimensionally, each of the sharing blocks including multiple adjacent pixels configured to generate signals according to amounts of light received externally and one read circuit that is common to the multiple adjacent pixels and configured to read the signals as pixel values; an offset calculator configured to, based on the acquired image data and using pixel values of pixels in a sharing block of interest that is one of the multiple sharing blocks and pixel values of pixels outside the sharing block of interest, detect an offset component of a pixel value occurring in the sharing block of interest; and a corrector configured to calculate a correction amount to correct a pixel value of at least one pixel in the sharing block of interest based on the offset component and use the correction amount to correct a pixel value of at least one pixel in the sharing block of interest.

The above and other features, advantages and technical and industrial significance of this disclosure will be better understood by reading the following detailed description of presently preferred embodiments of the disclosure, when considered in connection with the accompanying drawings.

DETAILED DESCRIPTION

Figure 1:
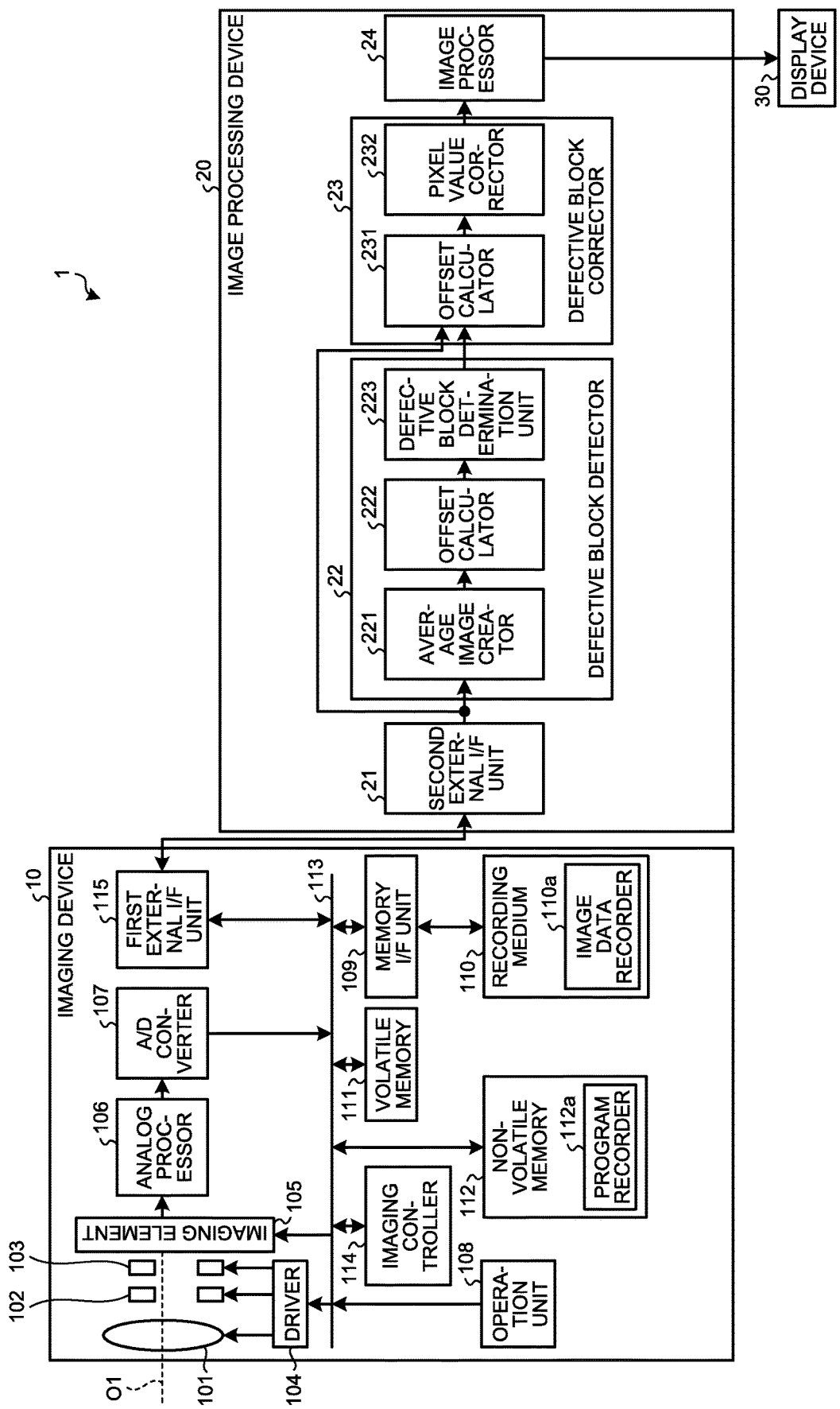
FIG. 1 is a block diagram schematically illustrating a configuration of an imaging system according to a first embodiment.

With reference to the accompanying drawings, modes for carrying out the present disclosure ("embodiments" below)

will be described below. The embodiments to be described below do not limit the disclosure. Furthermore, as for illustrations in the drawings, the same components will be denoted with the same reference numerals and described.

First Embodiment

Configuration of Imaging System

FIG. 1 is a block diagram schematically illustrating a configuration of an imaging system according to a first embodiment. An imaging system 1 illustrated in FIG. 1 includes an imaging device 10, an image processing device 20 and a display device 30.

Configuration of Imaging Device

First of all, a configuration of the imaging device 10 will be described. As illustrated in FIG. 1, the imaging device 10 includes an optical system 101, an diaphragm 102, a shutter 103, a driver 104, an imaging element 105, an analog processor 106, an A/D converter 107, an operation unit 108, a memory I/F unit 109, a recording medium 110, a volatile memory 111, a non-volatile memory 112, a bus 113, an imaging controller 114 and a first external I/F unit 115.

The optical system 101 consists of lenses. The optical system 101 consists of a focus lens and a zoom lens.

The diaphragm 102 adjusts the exposure by limiting the amount of incident light that is focused by the optical system 101. The diaphragm 102 limits the amount of incident light that is focused by the optical system 101 under the control of the imaging controller 114.

The shutter 103 sets the mode of the imaging element 105 in an exposure mode or a shielded mode. The shutter 103 consists of, for example, a focal plane shutter, etc. Without the shutter 103, a so-called electronic shutter that controls the amount of exposure electrically by controlling the imaging element 105 may be used.

Under the control of the imaging controller 114, which will be described below, the driver 104 drives the optical system 101, the diaphragm 102 and the shutter 103. For example, the driver 104 moves the optical system 101 along an optical axis O1 to change the zoom magnification of the imaging device 10 or adjust the focal position.

Under the control of the imaging controller 114, the imaging element 105 receives the light focused by the optical system 101, converts the light into image data (electric signals) and outputs the signals. The imaging element 105 consists of a complementary metal oxide semiconductor (CMOS) including multiple pixels that are arranged two-dimensionally, etc. In the first embodiment, a light source capable of applying different color lights in a time division manner is arranged additionally and no filter is arranged on the imaging element 105 and image data that is sequentially loaded while the color to be applied is being changed is used to generate color image data (frame sequential method). In front of each of the pixels of the imaging device 10, RGB filters of a Bayer pattern that transmit lights in different wavelength bands may be arranged. Furthermore, the imaging element 105 is not limited to the Bayer pattern and, needless to say, for example, a layered form, such as Fovion, may be de used. The filter to be used is not limited to RGB and any filter, such as cyan, yellow and magenta complementary filters may be used.

Figure 2:
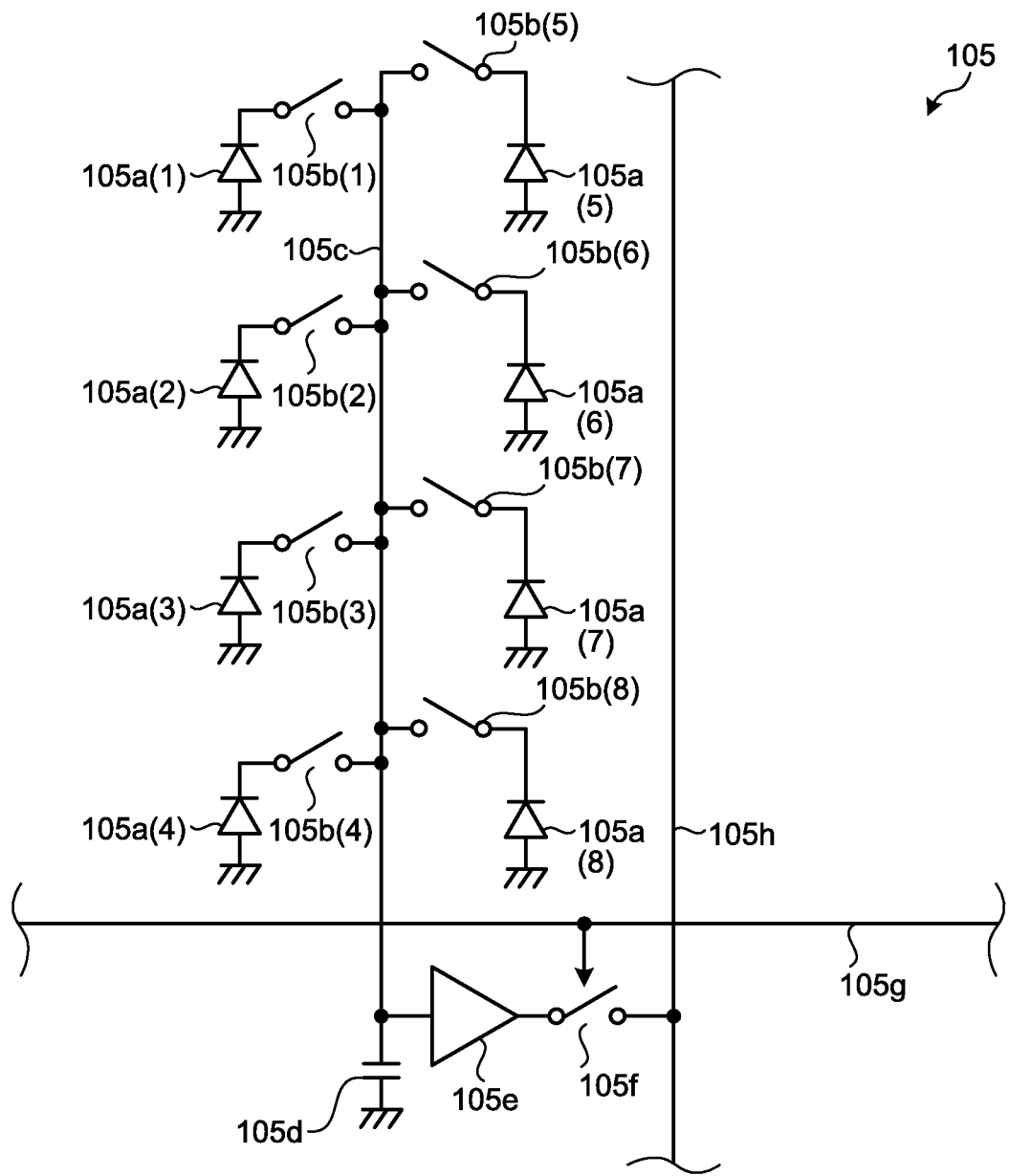
FIG. 2 is a schematic diagram schematically illustrating a configuration of the core of an imaging element according to the first embodiment.

The configuration of the imaging element 105 will be described in detail below. FIG. 2 is a schematic diagram schematically illustrating a configuration of the core of the imaging element 105. The imaging element 105 illustrated in FIG. 2 represents an example where the multiple pixels share a read circuit in order to increase sensitivity by increasing the aperture ratio of pixels. In the imaging element 105 illustrated in FIG. 2, one read circuit is arranged for eight pixels of two horizontal (lateral) pixels by four vertical (longitudinal) pixels. FIG. 2 illustrates the case where one group includes one read circuit arranged for eight pixels including two horizontal (lateral) pixels by four vertical (longitudinal) pixels, and the pixels and the read circuit described above are arranged horizontally and vertically in lines on the imaging element 105 of the first embodiment.

As illustrated in FIG. 2, the imaging element 105 includes multiple pixels 105a (photodiodes) 105a that receive light by exposure and perform photoelectric conversion to generate charges corresponding to the amounts of exposure; first switches 105b that are provided to the pixels 105a, respectively, and open or close according to the control of the imaging controller 114; a vertical transfer line 105c that vertically transfers the signals (charges) that are output from the respective pixels 105a; a floating diffusion (FD) unit 105d that accumulates the signals that are output from the respective pixels 105a; an amplifier 105e that amplifies the signals that are output from the FD unit 105d; a second switch 105f that opens or closes according to the control of the imaging controller 114; a control line 105g that controls the second switch 105f; and a transfer line 105h that transfers the electric signals that are amplified by the amplifier 105e.

When reading signals corresponding to the amounts of exposure at the pixels 105a(1) to 105a(8) as pixel values, the imaging element 105 configured as described above causes the FD unit 105d to enter a reset mode and the imaging controller 114 turns only the first switch 105b(1) to transfer the charge occurring at the pixel 105a(1) to the FD unit 105d. Thereafter, in the imaging element 105, the imaging controller 114 turns the second switch 105f on to cause the amplifier 105e to amplify the charges accumulated in the FD unit 105d and read (output) the amplified charges as a pixel value. The imaging element 105 then causes the FD unit 105d to enter a reset mode and the imaging controller 114 turns only the first switch 105b(2) on to transfer the charge occurring at the pixel 105a(2) to the FD unit 105d. In the imaging element 105, the imaging controller 114 then turns the second switch 105f on to cause the amplifier 105e to amplify the charges accumulated in the FD unit 105d and read the amplified charges as a pixel value. By performing such read operations sequentially, the imaging element 105 is able to output signals corresponding to amounts of exposure at the pixels 105a(1) to 105a(8) sequentially as pixel values. In the first embodiment, the FD unit 105d, the second switch 105f, the amplifier 105e and the control line 105g function as a read circuit that reads charges from the respective pixels 105a.

Figure 3:
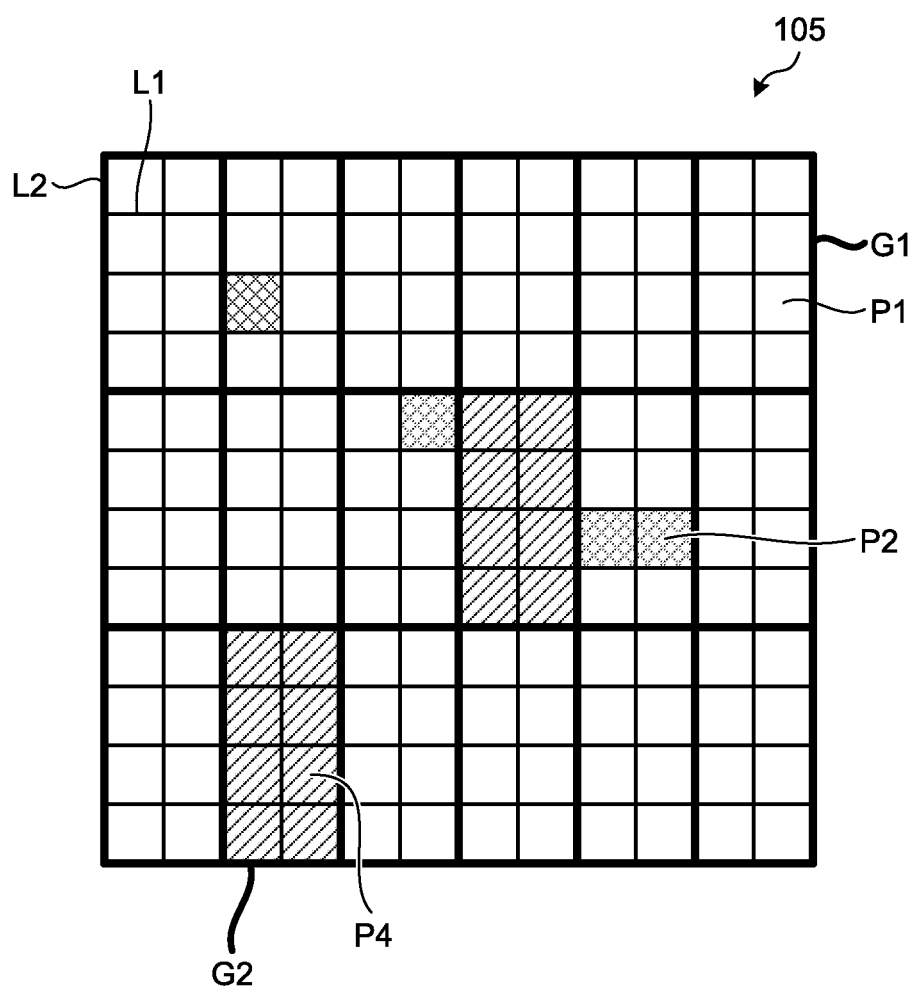
FIG. 3 is a diagram schematically illustrating exemplary occurrence of spots resulting from a read circuit in the imaging element according to the first embodiment.

Exemplary occurrence of spots resulting from the read circuit in the imaging element 105 will be described. FIG. 3 is a diagram schematically illustrating exemplary occurrence of spots resulting from the read circuit in the imaging element 105. FIG. 3 illustrates the case of sharing pixels where a single circuit reads signals of the eight pixels of lateral two pixels×longitudinal four pixels illustrated in FIG. 2. According to FIG. 3, each of squares P1 that are formed by thin lines L1 represents each pixel. A white square P1 represents a normal pixel and a black square P2 represents a defective pixel (a white spot whose pixel value keeps higher than those of normal pixels or a black spot whose pixel value keeps lower than those of normal pixels). Furthermore, a frame G1 formed by bold lines L2 represents pixels that output pixel values that are classified into the same pixel group (sharing block) and a group G2 consisting of slashed pixels P4 represent a defective block where a noise occurs due to a spot resulting from the read circuit. In other words, the defective block is an abnormal sharing block where, when a defect occurs in a read circuit, the pixel value of each pixel that is read via the read circuit is uniformly higher or lower than those of pixels around the pixel. As illustrated in FIG. 3, with the conventional method, in a case where pixels around a pixel of interest are referred to, for example, when an edge of a subject is imaged with the edge being adjacent to a defective block, when defective blocks are adjacent to each other, or when a defective pixel occurs around a defective lock, a difference value between the pixel value of a pixel of interest and the pixel value of a pixel around the pixel of interest cannot be calculated accurately and thus the defective block cannot be detected or corrected correctly.

FIG. 1 will be referred back to continue describing the configuration of the imaging device 10.

The analog processor 106 performs given analog signal processing on an analog signal that is input from the imaging element 105 and outputs the processed signal to the A/D converter 107. Specifically, the analog processor 106 performs noise reduction processing and gain-up processing etc., on the analog signal that is input from the imaging element 105. For example, the analog processor 106 performs beamforming after reducing a reset noise, etc., on the analog signal and performs gain-up to realize objective brightness.

The A/D converter 107 performs A/D conversion on the analog signal that is input from the analog processor 106 to generate digital image data ("RAW image data" below) and outputs the RAW image data to the volatile memory 111 via the bus 113. The A/D converter 107 may output the RAW image data directly to each unit of the imaging device 10 to be described below. The analog processor 106 and the A/D converter 107 may be provided to the imaging element 105 and the imaging element 105 may directly output the digital RAW image data.

The operation unit 108 gives various instructions of the imaging device 10. Specifically, the operation unit 108 includes a power switch that switches the power mode between an on-mode and an off-mode, a release switch that gives an instruction to capture a still image, an operation switch that switches among various settings of the imaging device 10, and a video switch that gives an instruction to capture a video.

The recording medium 110 consists of a memory card that is externally attached to the imaging device 10. The recording medium 110 is detachably attached to the imaging device 10 via the memory I/F unit 109. Under the control of the imaging controller 114, the recording medium 110 may output a program and various types of information to the non-volatile memory 112 via the memory I/F unit 109. Data of multiple images (for example, 100 images) that are captured with the imaging element 105 shielded from light is recorded in the recording medium 110. In the image data, addresses of respective pixels and pixel values are recorded in association with each other.

The volatile memory 111 temporarily stores image data that is input from the A/D converter 107 via the bus 113. For example, the volatile memory 111 temporarily stores image data that is output sequentially per frame by the imaging element 105 via the analog processor 106, the A/D converter 107 and the bus 113. The volatile memory 111 consists of a synchronous dynamic random access memory (SDRAM), etc.

The non-volatile memory 112 records various programs for operating the imaging device 10 and various types of data that are used while the programs are being executed. The non-volatile memory 112 includes a program recorder 112a. The non-volatile memory 112 consists of a flash memory, etc.

The bus 113 consists of a transfer path that connects the components of the imaging device 10, etc., and transfers various types of data that occur in the imaging device 10 to the components of the imaging device 10.

The imaging controller 114 consists of a central processing unit (CPU), etc. The imaging controller 114 transfers instructions and data to each component of the imaging device 10 according to instruction signals and release signals from the operation unit 108 to implement integral control on operations of the imaging device 10. For example, when a second release signal is input from the operation unit 108, the imaging controller 114 performs control to start an image capturing operation of the imaging device 10. The image capturing operation of the imaging device 10 refer to an operation performed by the analog processor 106 and the A/D converter 107 on the image data that is output by the imaging element 105. Under the control of the imaging controller 114, the image data processed as described above is recorded in the recording medium 110 via the bus 113 and the memory I/F unit 109.

While the first external I/F unit 115 outputs information that is input from an external device via the bus 113 to the non-volatile memory 112 or the volatile memory 111, the first external I/F unit 115 outputs information that is stored in the volatile memory 111, information that is stored in the non-volatile memory 112 and image data that is generate by the imaging element 105 to an external device via the bus 113. Specifically, the first external I/F unit 115 outputs the image data that is generated by the imaging element 105 to the image processing device 20 via the bus 113.

Configuration of Image Processing Device

A configuration of the image processing device 20 will be described. The image processing device 20 includes a second external I/F unit 21, a defective block detector 22, a defective block corrector 23 and an image processor 24.

The second external I/F unit 21 acquires the image data that is generated by the imaging element 105 via the first external I/F unit 115 of the imaging device 10 and outputs the acquired image data to the defective block detector 22 and the defective block corrector 23. In the first embodiment, the second external I/F unit 21 functions as an acquisition unit.

Based on the image data that is acquired by the second external I/F unit 21, the defective block detector 22 detects offset components of pixel values that occur in a sharing block consisting of multiple pixels that share a read circuit, using the pixel values of the pixels in the sharing block and pixel values of pixels outside the sharing block. Specifically, the defective block detector 22 detects an offset component of a pixel value that occurs in a sharing block based on the pixel value of the pixel in the sharing block and the pixel value of a pixel outside the sharing block and adjacent to the pixel in the sharing block. The defective block detector 22 includes an average image creator 221, an offset calculator 222 and a defective block determination unit 223. In the first embodiment, the defective block detector 22 functions as a detector.

The average image creator 221 acquires the data of multiple images (for example, 100 images) that are generated by the imaging element 105 in the shielded mode and that are recorded in an image data recorder 110a of the recording medium 110 via the second external I/F unit 21 and the first external I/F unit 115 and uses the acquired data of multiple images to create an average image.

The offset calculator 222 calculates offset components of the pixel values that occur in the sharing block, using the pixel values of the pixels in the sharing block and the pixel values of the pixels outside the sharing block. Specifically, by calculating a value obtained by subtracting, from the pixel value of a pixel in a sharing block with an address of interest, the pixel value of an adjacent pixel that is outside the sharing block with the address of interest and that is adjacent to the pixel in the sharing block, the offset calculator 222 calculates an offset component of the pixel value that occurs in the sharing block.

The defective block determination unit 223 determines whether the sharing block of interest is a defective block where noise occurs in pixel values due to the read circuit based on the offset components that are calculated by the offset calculator 222. Specifically, by determining whether an absolute of an offset level in the sharing block with the address of interest is larger than a given threshold, the defective block determination unit 223 determines whether the sharing block corresponding to the address of interest is a defective block. More specifically, when it is determined that the absolute value of the offset level in the sharing block with the address of interest is larger than the given threshold, the defective block determination unit 223 outputs the address of the sharing block to the defective block corrector 23 as a sharing block address where a defective block occurs.

The defective block corrector 23 calculates a correction amount to correct the pixel value of at least one pixel in the sharing block based on the offset components that are detected by the defective block detector 22 and use the correction amount to correct the pixel value of at least one pixel in the sharing block. The defective block corrector 23 includes an offset calculator 231 and a pixel value corrector 232. In the first embodiment, the defective block corrector 23 functions as a corrector. The defective block corrector 23 may calculate a correction amount to correct the pixel values of all the pixels in the sharing block based on the offset components that are detected by the defective block detector 22 and use the correction amount to correct the pixel values of all the pixels in the sharing block. Needless to say, the defective block corrector 23 may calculate a correction amount to correct the pixel values of multiple pixels in the sharing block based on the offset components that are detected by the defective block detector 22 and use the correction amount to correct the pixel values of the multiple pixels in the sharing block.

The offset calculator 231 uses the pixel values of the pixels in the sharing block and the pixel values of the pixels outside the sharing block to detect offset components that occur in the sharing block. Specifically, the offset calculator 231 calculate values each obtained by subtracting, from the pixel value of a pixel in the sharing block with the address of interest, the pixel value of an adjacent pixel that is outside the sharing block with the address of interest and that is adjacent to the pixel in the sharing block.

Using the offset level that is calculated by the offset calculator 231, the pixel value corrector 232 corrects the pixel values by uniformly subtracting the offset level from the pixel value of each of the pixels in the sharing block with the address of interest.

The image processor 24 performs given image processing on the image data where the pixel values of the pixels in the sharing block, which is a defective block, are corrected by the defective block corrector 23 and outputs the processed image data to the display device 30. The given image processing includes basic image processing including at least optical black subtraction processing and white balance adjustment processing and, when the imaging element has a Bayer pattern, image data synchronization processing, color matrix operations, γ correction processing, color reproduction processing, edge enhancement processing and noise reduction processing. The image processor 24 performs image processing to reproduce a natural image based on parameters of the respective sets of image processing that are set in advance. The parameters of the respective sets of processing include values of contrast, sharpness, chroma, white balance and gradation.

Configuration of Display Device

A configuration of the display device 30 will be described. The display device 30 displays an image corresponding to image data that is input from the image processing device 20. The display device 30 consists of a display panel, such as a liquid crystal or an electro luminescence (EL) panel, etc.

In the imaging system 1 having the above-described configuration, the image processing device 20 detects and corrects a defective block occurring in the image data that is generated by the imaging element 105 and the display device 30 displays an image corresponding to the image data on which the image processing device 20 has performed the image processing.

Processes Performed by Defective Block Detector

Figure 4:
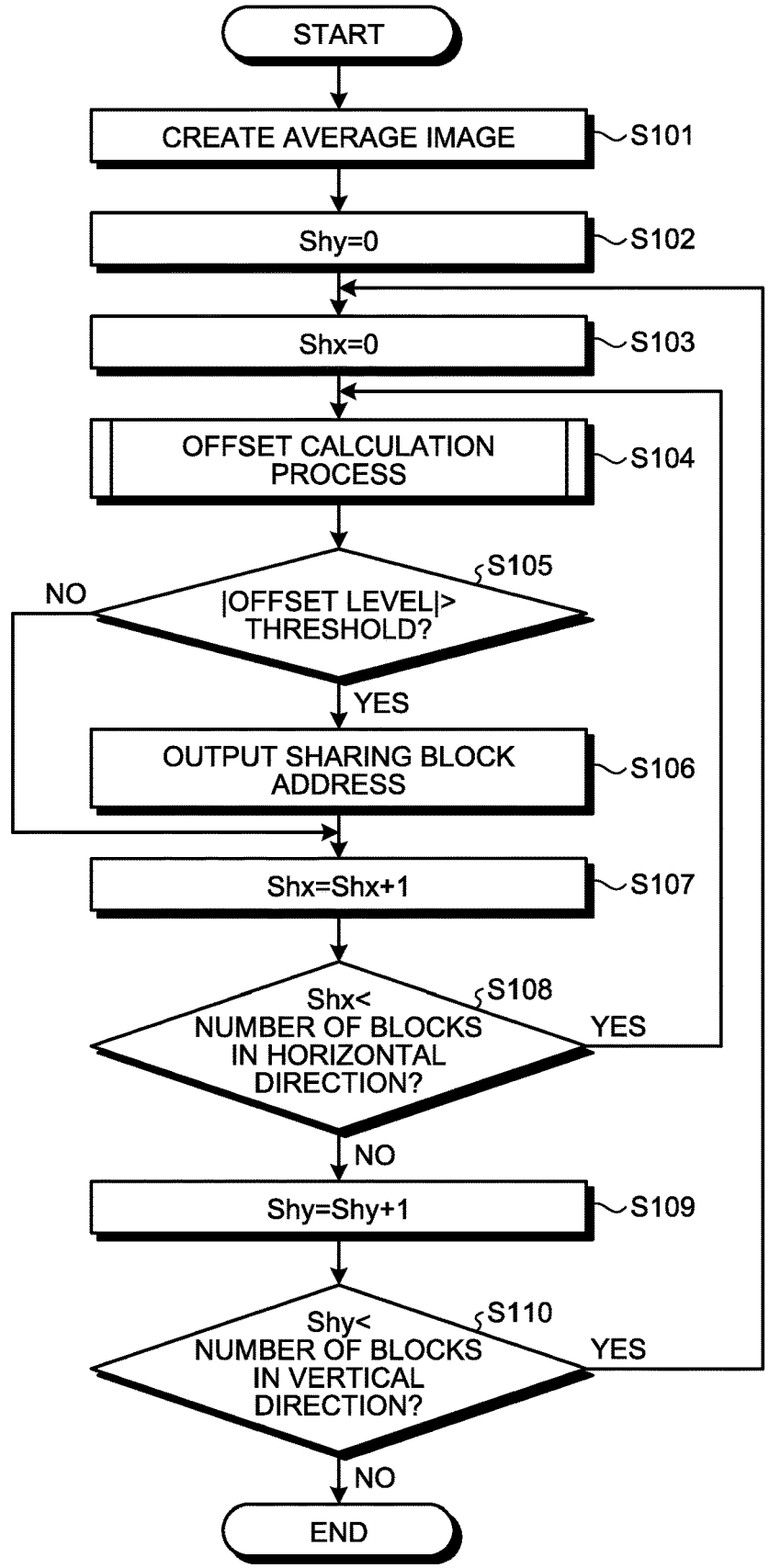
FIG. 4 is a flowchart illustrating an overview of processes executed by a defective block detector according to the first embodiment.

A process executed by the defective block detector 22 will be described. FIG. 4 is a flowchart illustrating an overview of processes executed by the defective block detector 22 and is a flowchart of a main routine that is executed by the defective block detector 22.

As illustrated in FIG. 4, first of all, the average image creator 221 acquires data of multiple images (100 images) that are generated by the imaging element 105 in the shielded mode and that is recorded in the image data recorder 110a of the recording medium 110 via the second external I/F unit 21 and the first external I/F unit 115 and uses the acquired data of the multiple images to create an average image (step S101). Specifically, using the data of the multiple images, the average image creator 221 calculates an average value of the pixels with respect to each pixel to create an average image. The data of the multiple images for the average image need not be generated by the imaging element 105 being blocked from light and may be a plane image, and image data that is generated with the imaging element 105 being blocked from light is preferable. In this case, the image data that is generated by the imaging element 105 being blocked from light has the lowest random noise and thus is preferable for detection.

Subsequently, the defective block detector 22 initializes the counter Shy representing the address of a sharing block of interest in the vertical direction (Shy=0) (step S102) and initializes a counter Shx representing the address of the sharing block of interest in the horizontal direction (Shx=0) (step S103). The sharing block at the upper left of the image data (the upper-left sharing block of the frame G1 surrounded by the bold line L2 represented in FIG. 3) serves as the origin and the address of the sharing block (Shx, Shy) is calculated on a sharing-block basis.

The offset calculator 222 executes an offset calculation process to calculate an offset level in the sharing block corresponding to the address (Shx, Shy) of interest (step S104). Details of the offset calculation process will be described below.

The defective block determination unit 223 determines whether the absolute value of the offset level in the sharing block with the address of interest (Shx, Shy) is larger than a given threshold (|offset level|>threshold) (step S105). The given threshold is preferably a level at which the defective block begins to become prominent and is preferably set in advance according to experiments, etc. Needless to say, the threshold may be changed as appropriate according to, for example, the temperature of the imaging element, etc. When the defective block determination unit 223 determines that the absolute value of the offset level in the sharing block with the address of interest (Shx, Shy) is larger than the given threshold (YES at step S105), the defective block determination unit 223 outputs the address of the sharing block (Shx, Shy) as the sharing block address where a defective block occurs to the defective block corrector 23 (step S106). After step S106, the defective block detector 22 moves to step S107 to be described below. On the other hand, when the defective block determination unit 223 determines that the absolute value of the offset level in the sharing block with the address of interest (Shx, Shy) is not larger than the given threshold (NO at step S105), the defective block detector 22 moves to step S107 to be described below.

At step S107, the defective block detector 22 increments the counter Shx (Shx=Shx+1).

When the counter Shx is smaller than the number of sharing blocks in the horizontal direction (Shx<the number of blocks in the horizontal direction) (YES at step S108), the defective block detector 22 returns to step S104 described above. On the other hand, when the counter Shx is not smaller than the number of sharing blocks in the horizontal direction (NO at step S108), the defective block detector 22 moves to step S109 to be described below.

At step S109, the defective block detector 22 increments the counter Shy (Shy=Shy+1).

When the counter Shy is smaller than the number of sharing blocks in the vertical direction (shy<the number of blocks in the vertical direction) (YES at step S110), the defective block detector 22 returns to step S103 described above. On the other hand, when the counter Shy in the vertical direction is not smaller than the number of sharing blocks in the vertical direction (NO at step S110), the defective block detector 22 ends the process.

Overview of Offset Calculation Process

Figure 5:
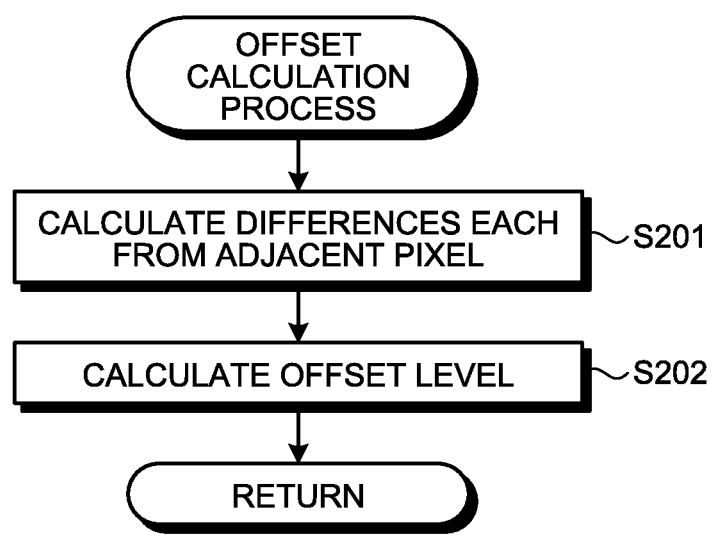
FIG. 5 is a flowchart illustrating an overview of an offset calculation process represented in FIG. 4.

Details of the offset calculation process described at step S104 in FIG. 4 will be described below. FIG. 5 is a flowchart illustrating an overview of the offset calculation process.

As illustrated in FIG. 5, first of all, the offset calculator 222 calculates values each obtained by subtracting, from the pixel value of a pixel in the sharing block with an address of interest (Shx, Shy), a pixel value of an adjacent pixel that is outside the sharing block and that is adjacent to the pixel in the sharing block (step S201). When the offset calculator 222 calculates a difference inversely, it suffices if addition is performed in the correction process performed by the defective block corrector 23. In the process at step S201, when the sharing block corresponding to the address of interest (Shy, Shy) is at an end of the image, the offset calculator 222 calculates the above-described differences of only combinations in each of which there is an adjacent pixel outside the sharing block.

Figure 6A:
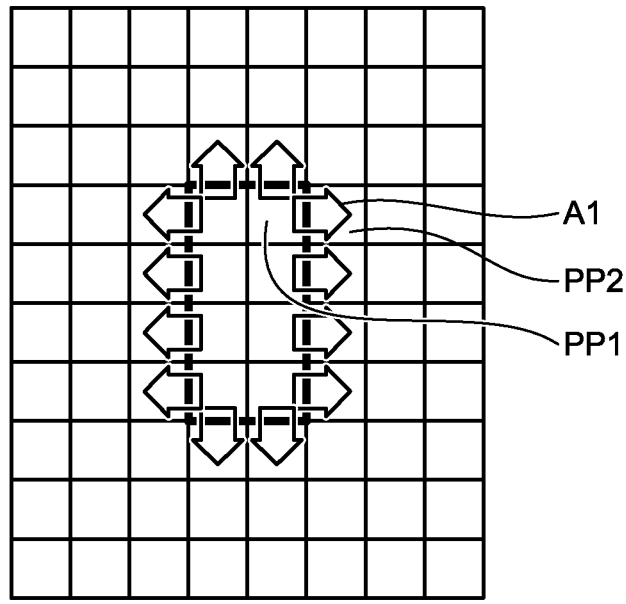
FIG. 6A is a diagram schematically illustrating an overview of offset calculation that is performed by an offset calculator according to the first embodiment.

FIG. 6A is a diagram schematically illustrating an overview of offset calculation performed by the offset calculator 222 and is a diagram schematically illustrating an over view of the offset calculation in the case where no color filter is set on the light receiving surface of the imaging element 105.

As illustrated in FIG. 6A, in the case of a 2×4 sharing block, the offset calculator 222 calculates differences each from an adjacent pixel outside the sharing block. Specifically, the offset calculator 222 subtracts the pixel value of a pixel PP2 in front of an arrow A1 from the pixel value of a pixel PP1 from which the arrow A1 originates. When there is no pixel in front of the arrow A1 at an end of an image, the offset calculator 222 does not calculate any difference corresponding to the arrow A1.

Figure 6B:
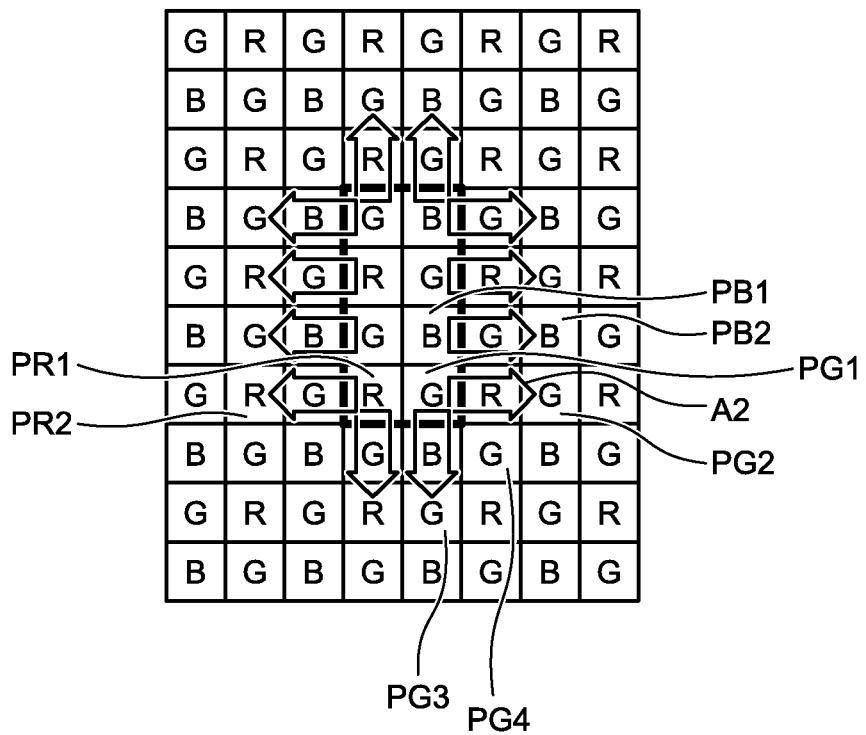
FIG. 6B is a diagram schematically illustrating an overview of offset calculation that is performed by the offset calculator according to the first embodiment.

FIG. 6B is a diagram schematically illustrating an overview of the offset calculation that is performed by the offset calculator 222 and is a diagram schematically illustrating an overview of the offset calculation in a case where a color filter is arranged on the receiving surface of the imaging element 105. FIG. 6B exemplifies a color filter with a Bayer pattern; however, the color filter is not limited to this and the same process may is performed with a complementary filter.

As illustrated in FIG. 6B, the offset calculator 222 calculates value each obtained by subtracting, from the pixel value of a pixel in the sharing block with an address of interest (Shx, Shy), the pixel value of an adjacent pixel that is adjacent to the pixel in the sharing block outside the sharing block and that has the same color as that of the pixel in the sharing block. Adjacent pixels are not limited to pixels adjacent to each other. Specifically, the offset calculator 222 subtracts the pixel value of a pixel PG2 in front of an arrow A2 from the pixel value of an original pixel PG1 from which the arrow A2 originates, subtracts the pixel value of a pixel PR2 in front of an arrow A2 from the pixel value of an original pixel PR1 from which the arrow A2 originates, and subtracts the pixel value of a pixel PB2 in front of an arrow A2 from the pixel value of an original pixel PB1 from which the arrow A2 originates. In this case, the offset calculator 222 need not necessarily distinguish between pixels having the same spectral sensitivity like Gr pixels on which filters Gr in the Bayer pattern are arranged (G pixels positioned in the row in which R pixels on which filters R are arranged are arranged) and the Gb pixels on which filters Gb are arranged (G pixels positioned in the row in which B pixels on which filters B are arranged). For example, in the case illustrated in FIG. 6B, as for the pixel PG1 (Gr pixel), the pixel value may be compared with the pixel value of the pixel PG2 (Gr pixel) or the pixel value of the pixel PG3 (Gr pixel) to calculate a difference and, needless to say, a difference from the pixel value of an obliquely adjacent pixel PG4 (Gb pixel) may be calculated. In other words, the offset calculator 222 detects offset components based on differences each between the pixel value of a pixel in the sharing block with the address of interest (Shx, Shy) and the pixel value of a pixel outside the sharing block that is positioned around the pixel in the sharing block with the address of interest (Shx, Shy).

FIG. 5 will be referred back to describe step S202 and the following steps.

At step S202, the offset calculator 222 calculates an offset level. Specifically, the offset calculator 222 calculates the median of the differences that are calculated at step S201 as an offset level of the sharing block in the address of interest (Shx, Shy). The offset calculator 222 may calculate an offset level based on statistics, such as a mode or an average, other than the median. In the case where the median is used, when there is a defective pixel within the sharing block with the address of interest (Shx, Shy) or among the pixels outside the sharing block that are adjacent to the pixels in the sharing block, the offset calculator 222 is able to reduce the effect of the defective pixel and calculate an offset level.

As for FIGS. 6A and 6B, the offset calculator 222 may calculate differences of all the combinations of all the outermost pixels in the sharing block with the address of interest (Shx, Shy) and pixels adjacent to the outermost pixels or may calculate differences partly (for example, of the four corners in the sharing group, G pixels or horizontal pixels). In other words, the more the offset calculator 222 calculates differences, the more the effects of random noise and defective pixels can be reduced. After step S202, the offset calculator 222 returns to the main routine in FIG. 4.

As described above, the defective block detector 22 calculates an offset level for each sharing block. When the absolute value of the calculated offset level of a sharing block is larger than the given threshold, the defective block detector 22 determines that a defective block has occurred and outputs the address (Shx, Shy) of the sharing block as a defective block to the defective block corrector 23.

Process Performed by Defective Block Corrector

Figure 7:
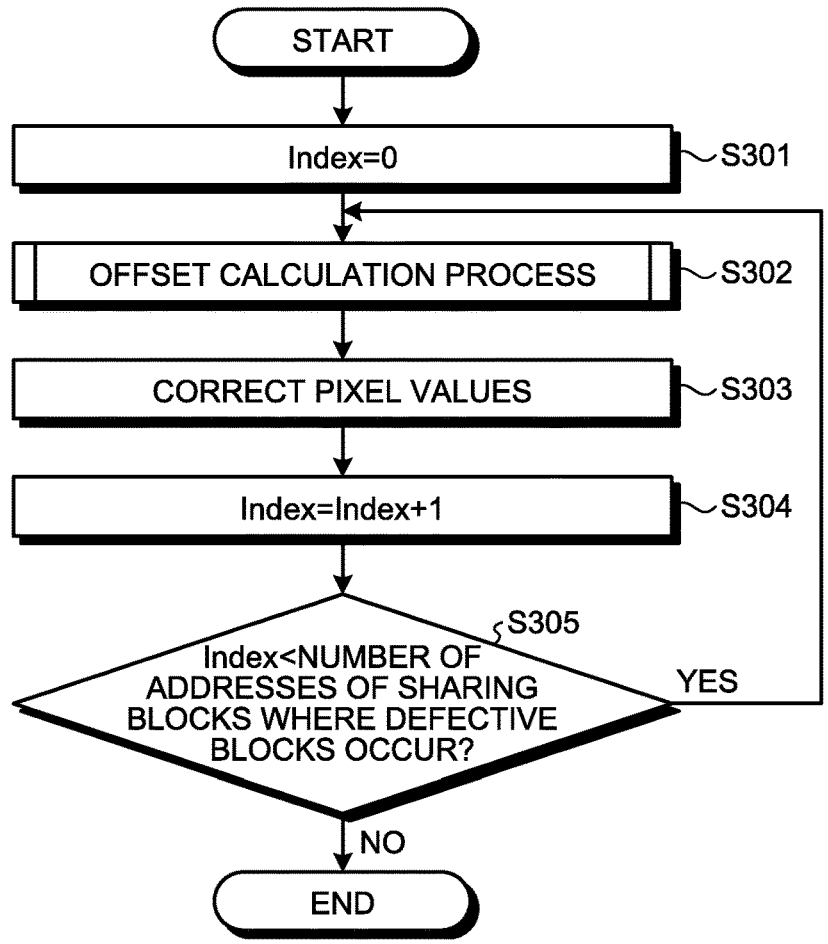
FIG. 7 is a flowchart illustrating an overview of processes that are executed by a defective block corrector according to the first embodiment.

A process that is executed by the defective block corrector 23 will be described. FIG. 7 is a flowchart illustrating an overview of the process that is executed by the defective block corrector 23 and is a flowchart of a main routine that is executed by the defective block corrector 23.

As illustrated in FIG. 7, first of all, the defective block corrector 23 initializes a variable representing Index of an array in which the addresses of sharing blocks where defective blocks occur are stored (Index=0) (step S301).

The offset calculator 231 then executes an offset calculation process to calculate an offset level of a sharing block with an address (Shx, Shy) that is stored as an Index-th address in the pattern where the address of the sharing block where the defective block occurs is stored (step S302). The offset calculation process performed by the offset calculator 231 is the same as the offset calculation process described with reference to FIG. 5 and thus descriptions thereof will be omitted.

The pixel value corrector 232 then corrects the pixel values by uniformly subtracting the offset level from the pixel values of each of the pixels in the sharing block with the address of interest (Shx, Shy), using the offset level that is calculated by the offset calculator 231 (step S303).

The defective block corrector 23 increments Index (Index=Index+1) (step S304).

Thereafter, when Index is smaller than the number of addresses of sharing blocks where defective blocks occur (Index<the number of addresses of sharing blocks where defective blocks occur) (YES at step S305), the defective block corrector 23 returns to step S302 described above. On the other hand, when Index is not smaller than the number of addresses of sharing blocks where defective blocks occur (NO at step S305), the defective block corrector 23 ends the process.

As described above, based on the addresses of sharing blocks where defective blocks occur and that are detected by the defective block detector 22, the defective block corrector 23 corrects the pixel value of each pixel in a sharing block where a defective block occurs in image data that is input from the second external I/F unit 21 and outputs the pixel value to the image processor 24.

According to the above-described first embodiment, as uniform offset is performed in the defective block, calculating an offset level using multiple differences makes it possible to reduce the effects of random noises and defective pixels and detect defective blocks and thus detect and correct defective blocks accurately.

In the first embodiment, the offset calculator 231 calculates an offset level of a corresponding sharing block based on the address (Shx, Shy) representing a defective block that is input from the defective block detector 22; however, the offset level is calculated in the same manner by the offset calculator 222 of the defective block detector 22. In this case, under the condition that the offset level of the defective block does not vary, the defective block detector 22 may output the address of the sharing block where a defective block occurs and the offset level at the detection (the offset level that is calculated by the offset calculator 222 at step S202 in FIG. 5) in association with each other to the defective block corrector 23. In this case, the offset calculator 231 of the defective block corrector 23 may omit the offset calculation process at step S302 in FIG. 7. As the offset level that is detected by the defective block detector 22 may vary according to the drive voltage and temperature of the imaging element 105, it is preferable that the defective block corrector 23 perform the offset calculation process to calculate an offset level again.

Second Embodiment

A second embodiment will be described. The second embodiment has the same configuration as that of the imaging system 1 according to the first embodiment but is different from the imaging system 1 according to the first embodiment in the offset calculation process. The offset calculation process that is executed by the offset calculator according to the second embodiment will be described below. The same components as those of the imaging system 1 according to the first embodiment are denoted with the same reference numerals as those of the first embodiment and descriptions thereof will be omitted.

Overview of Offset Calculation Process

Figure 8:
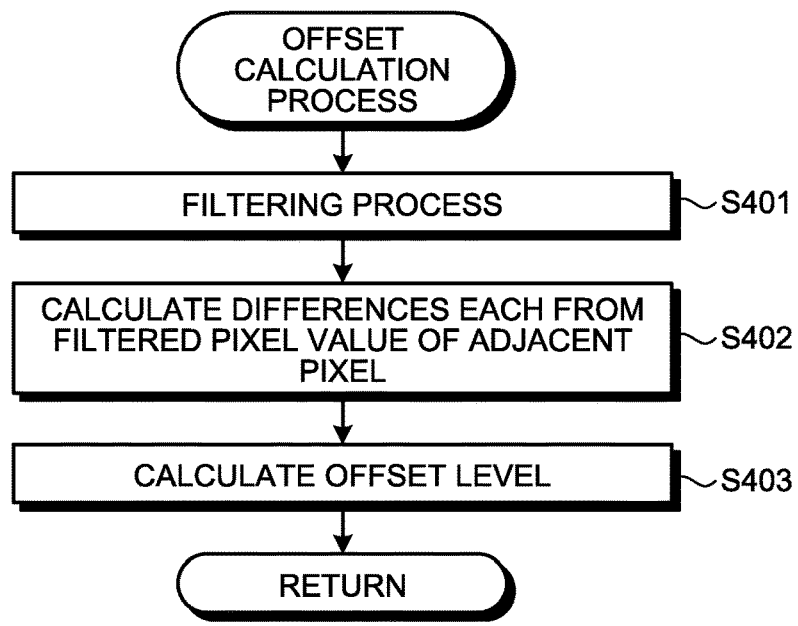
FIG. 8 is a flowchart illustrating an overview of an offset calculation process according to a second embodiment.

FIG. 8 is a flowchart illustrating an overview of the offset calculation process according to the second embodiment. In the second embodiment, as the offset calculator 222 and the offset calculator 231 perform the same process, only the offset calculation process executed by the offset calculator 222 will be described.

Figure 9A:
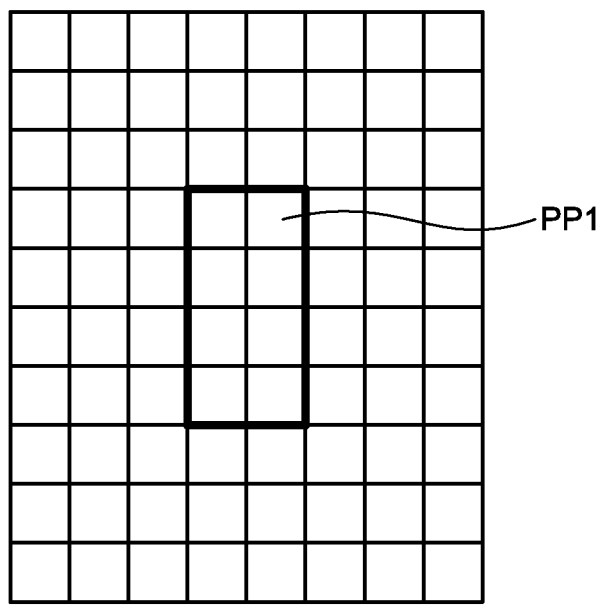
FIG. 9A is a diagram schematically illustrating the pixel value of each pixel before a filtering process.
Figure 9B:
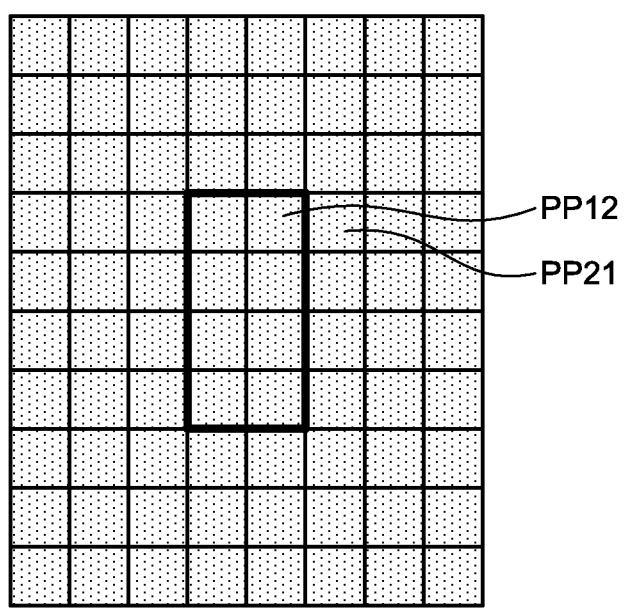
FIG. 9B is a diagram schematically illustrating the pixel value of each pixel after the filtering process.

As illustrated in FIG. 8, first of all, the offset calculator 222 performs a filtering process on the pixel value of each of the pixels of image data (step S401). For example, as illustrated in FIG. 9A, the offset calculator 222 generates image data consisting of pixels PP12 and PP21 obtained by performing a median filtering process (for example, 3×3), or the like, as a filtering process on the pixel value of each pixel PP1 of the image data (FIG. 9A→FIG. 9B). The offset calculator 222 may perform a known filtering process, such as a low-pass filtering process or a band-pass filtering process, other than the median filtering process. In this case, in order not to use the pixels in a sharing block with an address (Shx, Shy) and pixels outside the sharing block in a mixed manner, it is preferable that the offset calculator 222 perform a process of turning at each boundary or a copy process.

Figure 9C:
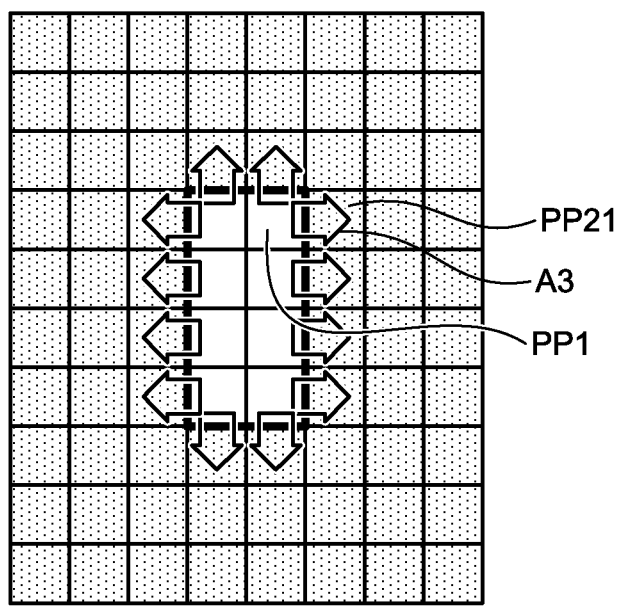
FIG. 9C is a diagram schematically illustrating an overview of offset calculation that is performed by an offset calculator according to the second embodiment of the present invention.

The offset calculator 222 then calculates differences each from the filtered pixel value of an adjacent pixel (step S402). Specifically, using the pixel values of the respective pixels in the sharing block with an address of interest (Shx, Shy) on which no filtering process has been performed (FIG. 9A) and a filtering process result obtained by executing the above-described filtering process at step S401 (see FIG. 9B), the offset calculator 222 calculates values each obtained by subtracting, from the pixel value of a pixel in the sharing block with the address of interest (Shx, Shy), the pixel value of an adjacent pixel that is outside the sharing block and that is adjacent to the pixel in the sharing block (see FIG. 9C). For example, as illustrated in FIG. 9C, the offset calculator 222 subtracts the pixel value of the pixel PP21 in front of an arrow A3 from the pixel value of a pixel PP1 from which the arrow A3 originates.

Thereafter, the offset calculator 222 calculates the median of the differences that are calculated at step S402 as an offset level of the sharing block with the address of interest (Shx, Shy) (step S403). The offset calculator 222 may calculate an offset level based on statistics, such as a mode or an average, other than the median. In the case where the median is used, when there is a defective pixel within the sharing block with the address of interest (Shx, Shy) or among the pixels outside the sharing block that are adjacent to the pixels in the sharing block, the offset calculator 222 is able to reduce the effect of the defective pixel and calculate an offset level. After step S403, the offset calculator 222 returns to the main routine in FIG. 4.

According to the second embodiment of the disclosure described above, using the filtered pixel values makes it possible to, even when there is a defective pixel around a defective block or when a random noise is large, exclude the effect of the defective pixel or random noise and detect and correct the defective block accurately.

In the second embodiment, the offset calculator 222 uses the pixel values in the sharing block with the address of interest (Shx, Shy) before the filtering process and the filtered pixel values outside the sharing block to calculate differences from the pixel values of the adjacent pixels. Instead of the pixel values of the respective pixels within the sharing block, the filtered pixel values may be used to calculate differences from the pixel values of the adjacent pixels. In other words, the offset calculator 222 may calculate, as an offset level, differences between the filtered pixel values of the respective pixels in the sharing block with the address of interest (Shx, Shy) and the pixel values of the pixels outside the sharing block that are adjacent to the pixels in the sharing block.

The second embodiment exemplifies the case where no color filter is arranged on the light receiving surface of each pixel of the imaging element 105. When a color filter is arranged, it suffices if only the pixel values of pixels each having the same spectral sensitivity as that of a pixel of interest (pixels each having the same color as that of a pixel of interest) are used to perform the filtering process.

Third Embodiment

A third embodiment will be described. An imaging system according to the third embodiment has the same configuration as that of the imaging system 1 according to the first embodiment but is different from the imaging system 1 according to the first embodiment in the offset calculation process. The offset calculation process that is executed by the offset calculator according to the third embodiment will be described below. The same components as those of the imaging system 1 according to the first embodiment are denoted with the same reference numerals as those of the first embodiment and descriptions thereof will be omitted.

Overview of Offset Calculation Process

Figure 10:
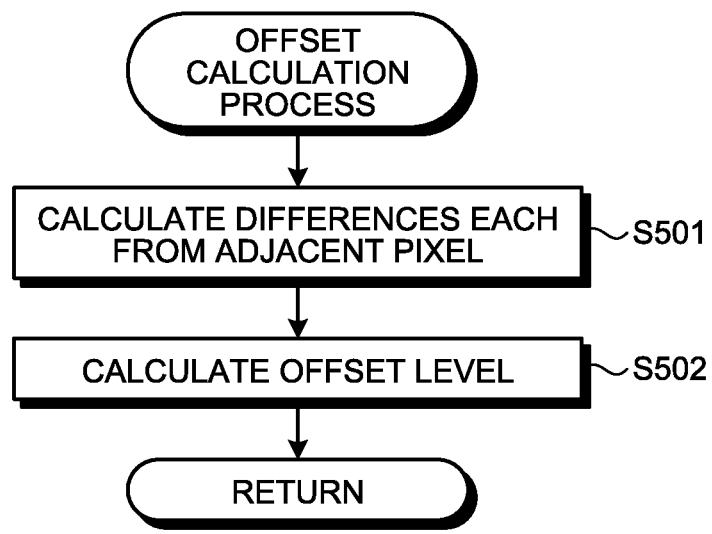
FIG. 10 is a flowchart illustrating an overview of an offset calculation process according to a third embodiment.

FIG. 10 is a flowchart illustrating an overview of the offset calculation process according to the third embodiment. In the third embodiment, as the offset calculator 222 and the offset calculator 231 perform the same process, only the offset calculation process executed by the offset calculator 222 will be described.

As illustrated in FIG. 10, first of all, the offset calculator 222 calculates differences each from an adjacent pixel (step S501).

Figure 11:
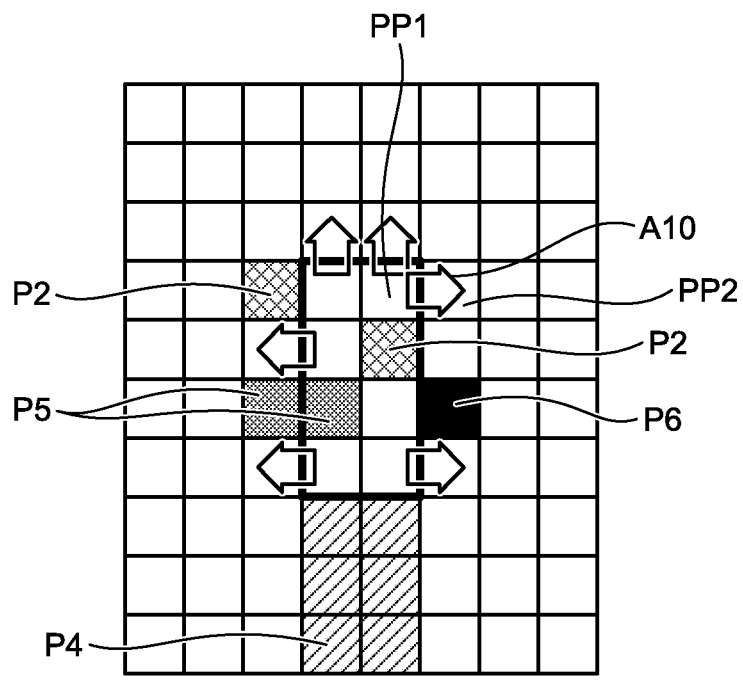
FIG. 11 is a diagram schematically illustrating an overview of offset calculation that is performed by an offset calculator according to the third embodiment.

FIG. 11 is a diagram schematically illustrating an overview of offset calculation that is performed by the offset calculator 222 and is a diagram schematically illustrating an overview of offset calculation in the case where no color filter is set on the light receiving surface of the imaging element 105. Each of the hatched pixels and the blacked-out pixel in FIG. 11 represents a defective pixel or a defective block. In other words, a pixel P2 represents a defective pixel due to a white spot or a black spot, pixels P4 represent pixels where spots due to the read circuit occur (a defective block), pixels P5 represent pixels with a luminance equal to or smaller than a luminous area threshold, and a pixel P6 represents a pixel with a luminance equal to or smaller than a luminous area threshold.

As illustrated in FIG. 11, the offset calculator 222 calculates values each obtained by subtracting, from the pixel value of a pixel in a sharing block with an address of interest (Shx, Shy), the pixel value of an adjacent pixel that is outside the sharing block and that is is adjacent to the pixel in the sharing block. In this case, when the two pixels are defective pixels or defective blocks, the offset calculator 222 does not calculate the difference of the combination. Specifically, as illustrated in FIG. 11, only in the state indicated by an arrow A10, the offset calculator 222 subtracts the pixel value of a pixel PP2 in front of the arrow A10 from the pixel value of a pixel PP1 from which the arrow A10 originates.

On the other hand, as illustrated in FIG. 11, when an adjacent pixel outside the sharing block is the defective pixel P2 or when the defective block P4 and the pixel in the sharing block is the defective pixel P2, the offset calculator 222 does not calculate the difference of the combination. Furthermore, when the pixel in the sharing block with the address of interest (Shx, Shy) is a defective pixel, when the pixel adjacent to the pixel in the sharing block is a defective pixel, or when the pixel adjacent to the pixel in the sharing block is a defective block, the offset calculator 222 does not calculate (cancels calculation of) the difference between the pixel value of the pixel in the sharing block and the pixel value of the pixel that is outside the sharing block and that is adjacent to the pixel in the sharing block.

Furthermore, when the pixel value of the pixel in the sharing block with the address of interest (Shx, Shy) and the pixel value of the adjacent pixel that is outside the sharing block and that is adjacent to the pixel in the sharing block have a luminance equal to or smaller than the luminous area threshold and a luminance equal to or smaller than the luminous area threshold, respectively, the offset calculator 222 does not calculate the differet of the combination. Specifically, as illustrated in FIG. 11, the offset calculator 222 cancels calculation of a difference between the pixel value of the pixel P5 in the sharing block and the pixel value of the pixel P5 adjacent to the pixel P5 in the sharing block.

FIG. 10 will be referred back to to describe step S502 and the following steps.

At step S502, the offset calculator 222 calculates an offset level. Specifically, the offset calculator 222 calculates the median of the differences that are calculated at step S501 as an offset level of the address of interest (Shx, Shy). The offset calculator 222 may calculate an offset level based on statistics, such as a mode or an average, other than the median. In the case where the median is used, the offset calculator 222 is able to reduce the effect of random noises or a subject to be imaged and calculate an offset level. After step S502, the offset calculator 222 returns to the main routine in FIG. 4.

According to the third embodiment, defective pixels and adjacent defective blocks are excluded and thus it is possible to exclude the effect of the defective pixels and defective blocks and detect and correct defective blocks accurately.

According to the third embodiment, as dark images and luminous images are excluded, even when an offset in the negative direction cannot be detected due to blocked-up shadows or when an offset cannot be detected due to blown-out highlights, it is possible to detect and correct a defective block accurately.

Fourth Embodiment

A fourth embodiment will be described. An imaging system according to the fourth embodiment has a configuration different from that of the imaging system 1 according to the first embodiment. The configuration of the imaging system according to the fourth embodiment will be described below. The same components as those of the first embodiment are denoted with the same reference numerals as those of the first embodiment and descriptions thereof will be omitted.

Configuration of Imaging System

Figure 12:
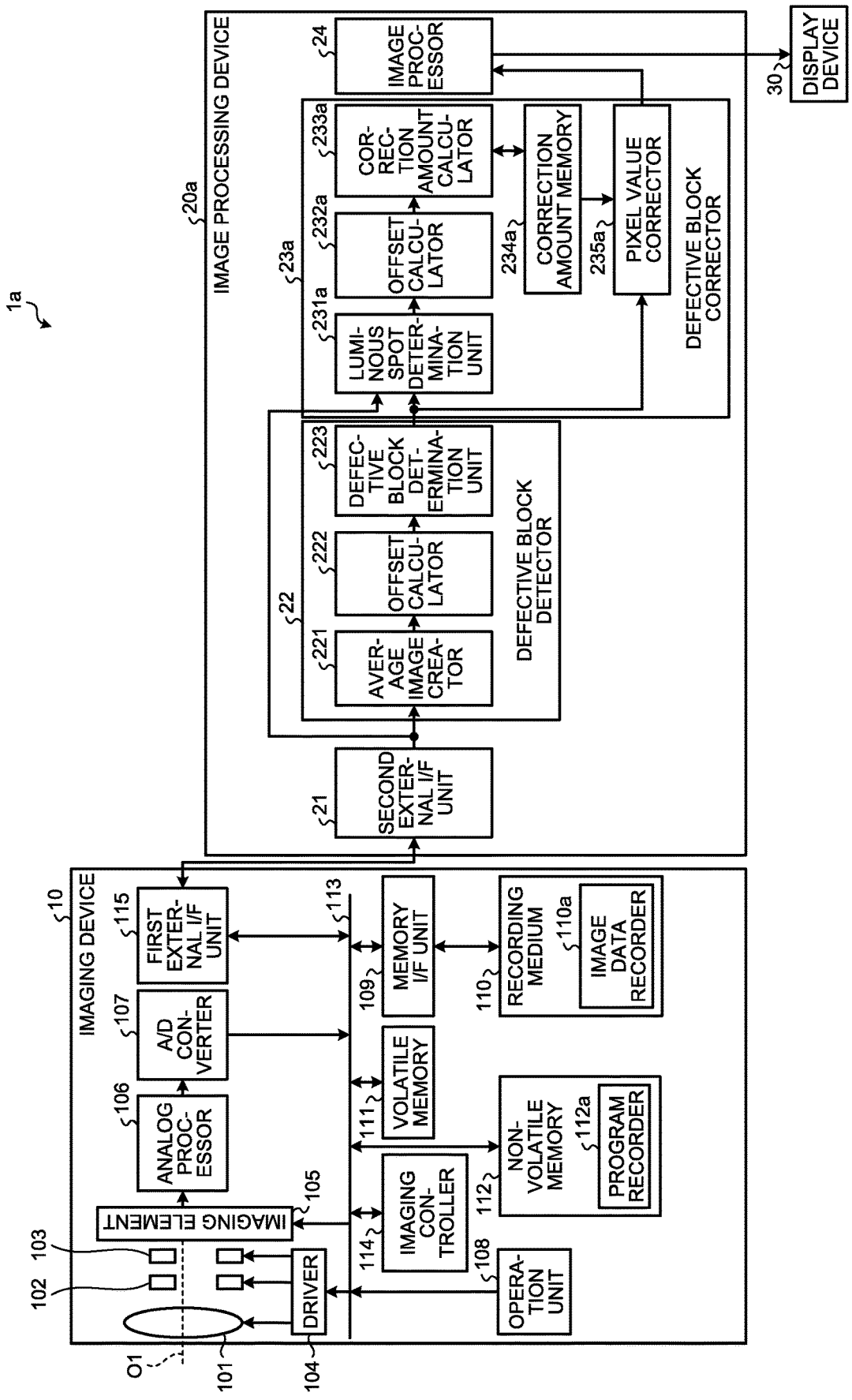
FIG. 12 is a block diagram schematically illustrating a configuration of an imaging system according to a fourth embodiment.

FIG. 12 is a block diagram schematically illustrating a configuration of the imaging system according to the fourth embodiment. An imaging system 1a illustrated in FIG. 12 includes an image processing device 20a instead of the image processing device 20 of the imaging system 1 according to the first embodiment.

Configuration of Image Processing Device

A configuration of the image processing device 20a will be described. The image processing device 20a includes a defective block corrector 23a instead of the defective block corrector 23 of the image processing device 20 according to the first embodiment.

The defective block corrector 23a includes a luminous spot determination unit 231a, an offset calculator 232a, a correction amount calculator 233a, a correction amount memory 234a and a pixel value corrector 235a.

The luminous spot determination unit 231a acquires PixT that is the third highest pixel value and PixB that is the third lowest pixel value in a sharing block that is stored in an index-th position in an array in which addresses of sharing blocks where defective blocks occur are stored and pixels around the sharing block (for example, each single pixel that is around the sharing block and that is adjacent to the sharing block) and determines whether the difference obtained by subtracting PixB, which is the third pixel value from the bottom, from PixT, which is the third pixel value from the top, is smaller than a threshold. The luminous spot determination unit 231a may detect a difference in luminance in a subject to be imaged other than a luminous spot and make determination. This enables prevention of false detection due to gradation of the subject.

The offset calculator 232a calculates offset components by executing the offset calculation process on the pixel values for which an offset level of the sharing block with the address stored as the index-th address in the array, in which the addresses of sharing blocks where defective blocks occur are stored, is to be calculated.

The correction amount calculator 233a acquires an index-th correction amount from the correction amount memory 234a and uses the acquired correction amount and the offset level that is calculated by the offset calculator 232a to adjust the correction amount.

The correction amount memory 234a consists of a read only memory (ROM), etc., and stores the correction amount that is calculated by the correction amount calculator 233a.

The pixel value corrector 235a acquires the correction amount from the correction amount memory 234a and uses the acquired correction amount to correct the pixel values by uniformly subtracting the correction amount from the pixel value of each of the pixels in the address.

Process Performed by Defective Block Corrector

Figure 13:
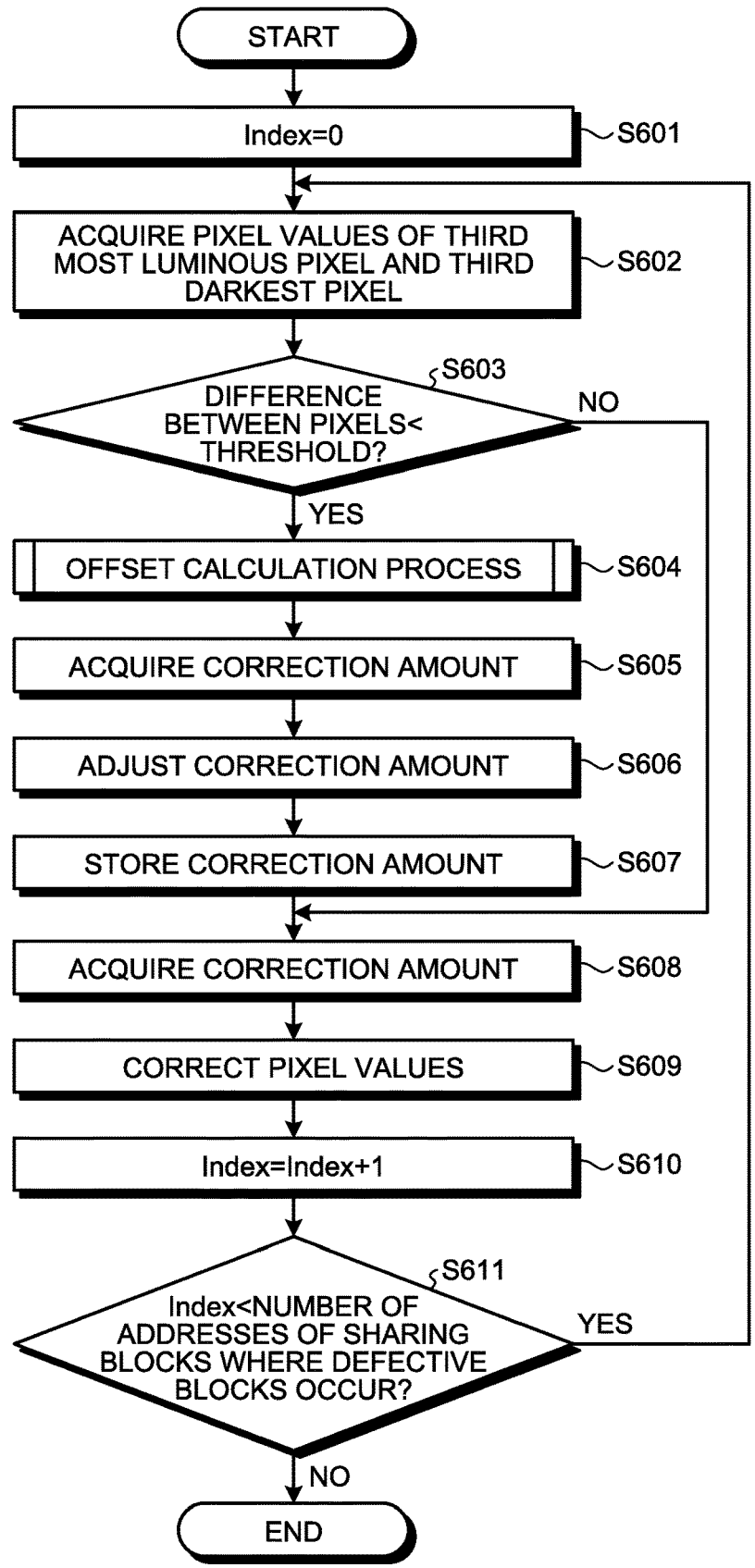
FIG. 13 is a flowchart illustrating an overview of processes that are executed by a defective block corrector according to the fourth embodiment.

The process executed by the defective block corrector 23a will be described. FIG. 13 is a flowchart illustrating an overview of the process that is executed by the defective block corrector 23a and is a flowchart of a main routine that is executed by the defective block corrector 23a.

As illustrated in FIG. 13, first of all, the defective block corrector 23a initializes a variable representing Index of the array in which the addresses of sharing blocks where defective blocks occur are stored (Index=0) (step S601).

The luminous spot determination unit 231a then acquires PixT that is the third highest pixel value and PixB that is the third lowest pixel value in a sharing block with an address of interest (Shx, Shy) that is stored as an index-th address in an array in which the addresses of sharing blocks where defective blocks occur are stored and pixels around the sharing block (for example, each single pixel that is around the sharing block and that is adjacent to the sharing block, i.e., the pixels that are positioned around the sharing block and that are used for the offset calculation process) (step S602). PixT is described as the third highest pixel value and the PixB is described as the third lowest pixel value; however, they need not necessarily be the third ones. The fourth embodiment assumes two surrounding defective pixels at maximum as illustrated in FIG. 3 and thus PixT and PixB are the third ones. Thus, a change may be made as appropriate according to the number of possible defective pixels around the sharing block.

The luminous spot determination unit 231a then determines whether the difference obtained by subtracting PixB that is the third lowest pixel value from PixT that is the third highest pixel value is smaller than a threshold (PixT−PixB<threshold) (step S603). The threshold is 1.5 times the maximum offset level to be detected in consideration of the maximum offset level to be detected and random noises. When it is determined that the difference obtained by subtracting PixB that is the third lowest pixel value from PixT that is the third highest pixel value is smaller than the threshold (YES at step S603), the defective block corrector 23a moves to step S604 to be described below. On the other hand, when it is determined that the difference obtained by subtracting PixB that is the third lowest pixel value from PixT that is the third highest pixel value is not smaller than the threshold (No at step S603), the defective block corrector 23a moves to step S608 to be described below.

At step S604, the offset calculator 232a executes the offset calculation process to calculate an offset level of the pixel values of the sharing block with the address of interest (Shx, Shy) that is stored as the Index-th address in the array in which the addresses of sharing blocks where defective blocks occur are stored. The offset calculation process that is performed by the offset calculator 232a is the same as the offset calculation process that is described with reference to any one of FIGS. 5, 8 and 10 described above and thus descriptions thereof will be omitted.

The correction amount calculator 233a then acquires an Index-th correction amount from the correction amount memory 234a (step S605). The correction amount is initialized by a given value (for example, 0 or the offset level that is detected at the detection performed by the defective block detector 22) in advance. The timing of initialization is the timing when the power of the imaging system 1a is turned on or, for example, when the imaging system 1 consists of an endoscope system, the timing when an endoscope (the imaging device 10) is connected to a processor (the image processing device 20a).

The correction amount calculator 233a uses the correction amount that is acquired at step S605 and the offset level that is calculated by the offset calculator 232a at step S604 to adjust the correction amount (step S606). For example, the correction amount calculator 233a calculates the correction amount that is adjusted by, for example, a coefficient α. Specifically, under the condition 0<α<1, the correction amount calculator 233a calculates an adjusted correction amount υ according to Equation (1) given below, where β denotes the correction amount that is acquired at step S605 and γ denotes the offset level that is calculated by the offset calculator 232a at step S604.

$$\upsilon = \alpha \times \gamma + (1-\alpha) \times \beta \quad (1)$$

The correction amount calculator 233a stores the correction amount that is adjusted at step S606 as the Index-th correction amount in the correction amount memory 234a (step S607).

The pixel value corrector 235a then acquires the index-th correction amount from the correction amount memory 234a (step S608).

The pixel value corrector 232 uses the correction amount, which is acquired at step S608, to correct the pixel values by uniformly subtracting the correction amount, which is acquired at step S608, from the pixel value of each of the pixels in the address of interest (Shx, Shy) (step S609).

The defective block corrector 23a then increments Index (Index=Index+1) (step S610).

When Index is smaller than the number of addresses of sharing blocks where defective blocks occur (Index<the number of addresses of sharing blocks where defective blocks occur) (YES at step S611), the defective block corrector 23a returns to step S602 described above. On the other hand, when Index is not smaller than the number of addresses of sharing blocks where defective blocks occur (NO at step S611), the defective block corrector 23a ends the process.

According to the fourth embodiment, it is possible to calculate an offset level accurately from image data with respect to a defective block whose offset level differs between detection and correction.

According to the fourth embodiment, even when the offset level varies more or less according to the subject to be imaged or random noises, it is possible to calculate a stable correction amount and thus it is possible to detect and correct a defective block accurately.

In the fourth embodiment, the correction amount that is adjusted by the pixel value corrector 235a is incorporated into the immediate correction to perform correction. Alternatively, the incorporation may be put behind and correction may be performed. Specifically, the correction amount calculator 233a may adjust the correction amount for given frames (for example, the number of frames for few seconds) and stores the adjusted correction amount in the correction amount memory 234a and then the pixel value corrector 235a may correct the pixel values after the given frames pass. The pixel value corrector 235a may adjust the correction amount and store the adjusted correction amount in the correction amount memory 234a until the correction amount converges to some extent (for example, until the amount of change of the correction amount becomes equal to or smaller than a given level) and then, after the correction amount converges, the pixel value corrector 235a may correct the pixel values.

Fifth Embodiment

A fifth embodiment will be described. An imaging system according to the fifth embodiment has the same configuration as that of the imaging system 1a according to the fourth embodiment but is different from the imaging system 1a only in the process executed by the defective block corrector. The process that is executed by the defective block corrector according to the fifth embodiment will be described below. The same components as those of the imaging system 1a according to the fourth embodiment are denoted with the same reference numerals as those of the fourth embodiment and descriptions thereof will be omitted.

Figure 14:
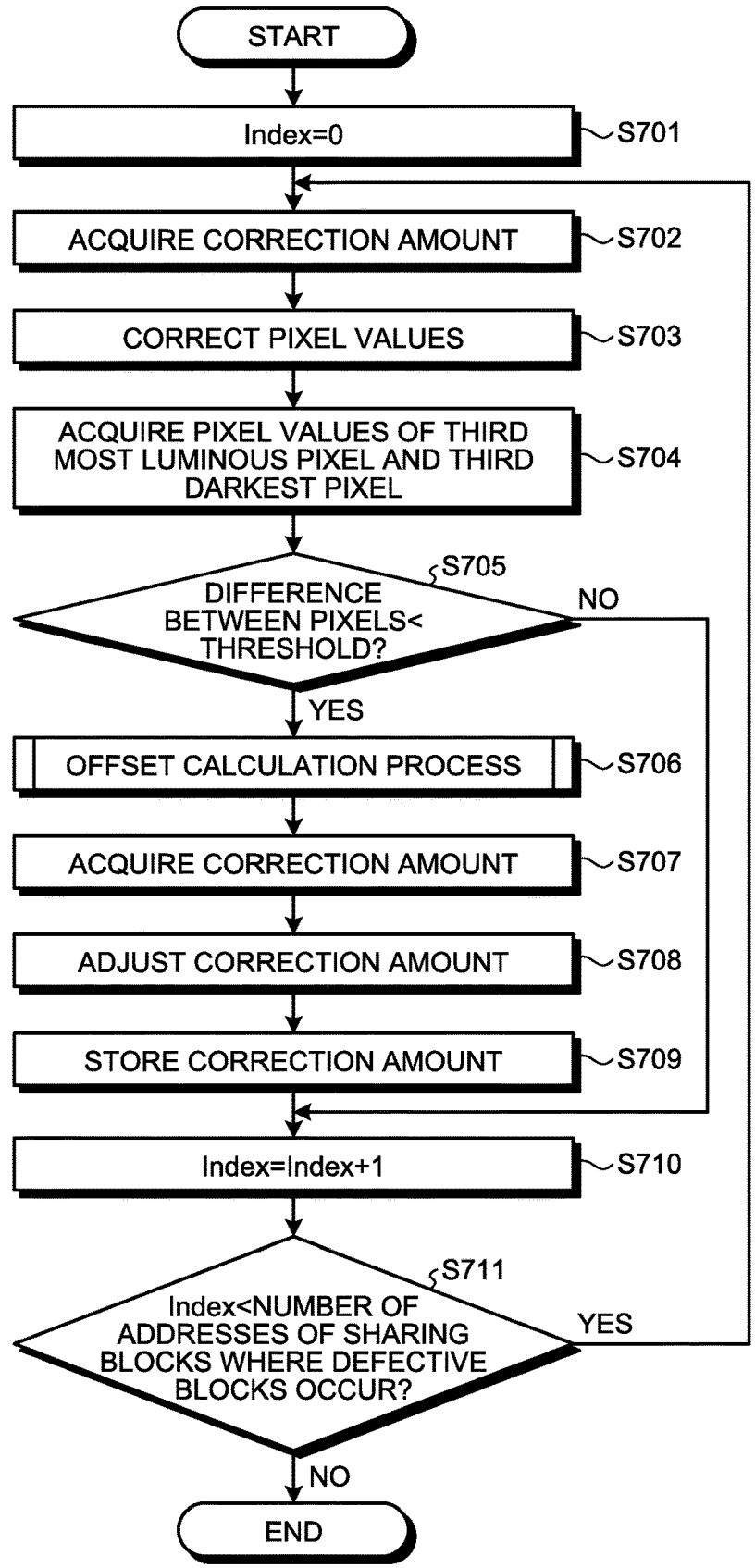
FIG. 14 is a flowchart illustrating an overview of processes that are executed by a defective block corrector according to a fifth embodiment.

Process performed by Defective Block Corrector FIG. 14 is a flowchart illustrating an overview of processes that are executed by the defective block corrector 23a according to the fifth embodiment and is a flowchart of the main routine that is executed by the defective block corrector 23a. Step S701 in FIG. 14 corresponds to step S601 in FIG. 13 described above.

At step S702, the pixel value corrector 235a acquires an Index-th correction amount from the correction amount memory 234a.

The pixel value corrector 235a uses the correction amount that is acquired at step S702 to correct the pixel values by subtracting the correction amount that is acquired at step S702 from the pixel value of each of the pixels in an address of interest (Shx, Shy) (step S703). The pixel value corrector 235a stores the corrected pixel values in the correction amount memory 234a.

Steps S704 to S709 correspond to step S602 to S607 in FIG. 13, respectively. Steps S710 and S711 correspond to S610 and S611 in FIG. 13, respectively.

At step S706, when calculating an offset of the address of interest (Shx, Shy), the pixel value corrector 235a uses the pixel values of the respective pixels in the address of interest (Shx, Shy) before being corrected at step S703. The pixel value corrector 235a may use the pixel values of the pixels outside the address of interest (Shx, Shy) before being corrected as at step S604 or the pixel values that are corrected. Using the corrected pixel values as the pixel values outside the address of interest (Shx, Shy) enables, in a case of connected defective blocks (when multiple sharing blocks that are adjacent to each other are defective blocks), the pixel value corrector 235a to detect an offset for which the effect of the defect occurring in the adjacent defective block is reduced.

According to the fifth embodiment, the pixel values are corrected first and the timing to incorporate the calculated offset level into the correction amount is put behind and accordingly it is possible to perform correction and calculation of the correction amount in parallel and thus, compared to the fourth embodiment, it is possible to put the timing when the corrected image data is output earlier and detect and correct a defective block accurately.

According to the fifth embodiment, the pixel values are corrected first and thus an image data that is necessary for correction and that corresponds to lines necessary to calculate an offset level and adjust the correction amount need not be stored, and accordingly it is possible to reduce the buffer capacity. As a result, when the defective block corrector 23a is realized by hardware, the hardware scale can be reduced.

In the fifth embodiment, the correction amount that is adjusted by the pixel value corrector 235a is incorporated into correction of image data that is captured at the following timing (image data of the next frame). Alternatively, the incorporation into correction may be put behind and correction may be performed. Specifically, the correction amount calculator 233a may adjust the correction amount for given frames (for example, the number of frames for few seconds) and stores the adjusted correction amount in the correction amount memory 234a and then the pixel value corrector 235a may correct the pixel values after the given frames pass. The pixel value corrector 235a may adjust the correction amount and store the adjusted correction amount in the correction amount memory 234a until the correction amount converges to some extent (for example, until the amount of change of the correction amount becomes equal to or smaller than a given level) and then, after the correction amount converges, the pixel value corrector 235a may correct the pixel values.

Other Embodiments

In the embodiments, a defective block is determined in advance and the pixel values of pixels in a sharing block where the defective block occurs are corrected. Alternatively, by performing offset calculation in real time on all the sharing blocks, using data of captured images, to determine defective blocks, the pixel values of pixels in a sharing block that is a defective block may be corrected without determining defective block in advance.

In the embodiments, when a color filter is arranged on the light receiving surface of the imaging element, a color filter with the Bayer pattern consisting of R filters, G filters and B filters is used; however, the present disclosure may be applied even with other color filters. Specifically, according to the disclosure, instead of the color filter with the Bayer pattern, a color filter consisting of complementary Cy (cyan) filters, R filters and B filters may be arranged on the light receiving surface of the imaging element according to any one of the above-described first to fifth embodiment. Furthermore, according to the present disclosure, a color filter in which R filters, G filters and B filters are obliquely arranged may be used. Furthermore, according to the present disclosure, a color filter that is a complementary filter using Cy (cyan) filters, Ma (magenta) filters and Ye (yellow) filters may be used. According to the present disclosure, a color filter using W filters (no-color white filter), Mg filters and G filters may be used.

According to the embodiments, multiple color filters having different spectral transmittances are provided in one imaging element. Alternatively, the present disclosure may be applied even to a double imaging device using an imaging element in which, for example, only G filters that transmit the wavelength band of green is provided on the light receiving surface of each pixel or over the imaging element and an imaging element in which R filters and B filters that transmit the wavelength band of red or blue are provided alternately in a check pattern to the light receiving surface of each pixel or to a triple imaging device using imaging devices in which only R filters, only G filters and only B filters are provided, respectively. In this case, when a correction coefficient of the G pixels in one of the imaging elements is calculated, it is possible to calculate a correction amount according to the present disclosure by using the pixel values of the R pixels or the B pixels of another imaging delement that correspond to the sets of coordinates of the G pixels.

The embodiments exemplify the sharing block consisting of pixels of two horizontal pixels×four vertical pixels (2×4 pixels); however, the present disclosure may be also applied to a sharing block consisting of a different number of pixels. For example, the present disclosure may be also applied to a sharing block consisting of pixels of one horizontal pixel×four vertical pixels (1×4) or a sharing block consisting of pixels of four horizontal pixels and four vertical pixels (4×4).

The embodiments employs the configuration in which the image processing device includes the defective block detector. Alternatively, the defective block detector may be provided outside the device and the sharing block addresses where defective blocks occur that are detected in advance may be stored in a non-volatile memory and the image processing device may acquire the sharing block addresses from the non-volatile memory via the second external I/F unit. In other words, in a factory where endoscopes (scopes), etc., are manufactured, sharing block addresses where defective blocks occur may be detected with a jig or an image processing device to detect defective blocks and the sharing block addresses may be recorded in a non-volatile memory of an endoscope or a scope ID and a processing device (processor) to which the endoscope is connected may acquire the sharing block addresses where defective blocks occur in association with the scope ID from the non-volatile memory of the endoscope. This enables the processing device (processor) to correct the defective blocks based on the sharing block addresses that are acquired from the endoscope. In short, even under the circumstance where the user performs only correction when using the endoscope, the present disclosure may be applied.

The present disclosure is not limited to the above-described embodiments and, needless to say, various types of modifications and application can be implemented within the scope of the disclosure. For example, the present disclosure is applicable to, in addition to the imaging device that is used to describe the disclosure, any device capable of capturing images of a subject, such as a portable device including an imaging element, such as a mobile phone or a smartphone, or an imaging device that captures images of a subject via an optical device, such as a video camera, an endoscope, a monitoring camera or a microscope.

The present disclosure is also applicable to even image data other than image data used for display or recording, such as image data of an OB area or an area outside an image circle without optical design assurance.

In the descriptions of the flowcharts of operations herein, expressions such as, "first of all", "then", "subsequently" "thereafter" are used to describe the operations; however, this does not mean that the operations have to be performed in this order.

Any of the method of each process performed by the image processing device according to the above-described embodiments, that is, the processes represented in each flowchart, may be stored as a program that can be executed by a controller, such as a CPU. Additionally, the program may be stored in a storage medium of an external storage device, such as a memory card (such as a ROM card or a RAM card), a magnetic disk (a floppy disk (trademark) or a hard disk), an optical disk (CD-ROM or a DVD) or a semiconductor memory and may be distributed. A controller, such as a CPU, is able to read the program that is stored in the storage medium of the external storage device, and the read program controls the operations and accordingly the above-described processes can be executed.

The disclosure realizes an effect that a defective block can be detected and corrected accurately.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image processing device comprising:
a processor configured to:
acquire image data generated by an imaging sensor including sharing blocks arranged two-dimensionally, each of the sharing blocks including multiple adjacent pixels configured to generate signals according to amounts of light received externally and one read circuit that is common to the multiple adjacent pixels and configured to read the signals as pixel values;
based on the acquired image data and using pixel values of pixels in a sharing block of interest that is one of multiple sharing blocks and pixel values of pixels outside the sharing block of interest, detect an offset component of a pixel value occurring in the sharing block of interest;
calculate a correction amount to correct a pixel value of at least one pixel in the sharing block of interest based on the offset component and use the correction amount to correct a pixel value of at least one pixel in the sharing block of interest; and
determine whether the sharing block of interest is a defective block where a noise occurs in a pixel value due to the read circuit based on the detected offset component;
wherein the calculation of the correction amount corrects the pixel value of at least one pixel in the sharing block of interest based on the detected offset component for the sharing block of interest that is determined as the defective block and, the correction amount is used to correct the pixel value of at least one pixel in the sharing block of interest.

2. The image processing device according to claim 1, wherein the detection of the offset component is based on a difference between a pixel value of a pixel in the sharing block of interest and a pixel value of a pixel that is outside the sharing block of interest and that is adjacent to the pixel in the sharing block of interest.

3. The image processing device according to claim 2, wherein the detection of the offset component comprises calculating differences between each of pixel values of multiple pixels in the sharing block of interest and each of pixel values of pixels that are outside the sharing block of interest and that are positioned around the respective pixels in the sharing block of interest and calculating the offset components based on the calculated differences.

4. The image processing device according to claim 1, wherein the detection of the offset component is based on a difference between a pixel value of a pixel in the sharing block of interest and a pixel value of a pixel that is outside the sharing block of interest and that is positioned around the pixel in the sharing block of interest.

5. The image processing device according to claim 1, wherein the detection of the offset component is based on a difference between a pixel value of a pixel in the sharing block of interest and a corrected pixel value of a pixel that is outside the sharing block of interest and that is positioned around the pixel in the sharing block of interest.

6. The image processing device according to claim 1, further comprising a color filter that transmits sets of light in multiple wavelength bands different from one another arranged on a light receiving surface of the imaging sensor element, and
wherein the detection of the offset component is based on a difference between a pixel value of a pixel in the sharing block of interest and a pixel value of a pixel that is outside the sharing block of interest and that has a same color as the pixel in the sharing block of interest.

7. The image processing device according to claim 6, wherein the detection of the offset component is based on a difference between the pixel value of the pixel in the sharing block of interest and a corrected pixel value of the pixel that is outside the sharing block of interest and that has a same color as the pixel in the sharing block of interest.

8. The image processing device according to claim 2, wherein the detection of the offset component comprises, when the pixel in the sharing block of interest is a defective pixel, when the pixel adjacent to the pixel in the sharing block of interest is a defective pixel, or when the pixel adjacent to the pixel in the sharing block of interest is a defective pixel where a noise occurs in a pixel value due to the read circuit, canceling calculating the difference between the pixel value of the pixel in the sharing block of interest and the pixel value of the pixel that is outside the sharing block of interest and that is adjacent to the pixel in the sharing block of interest.

9. The image processing device according to claim 1, wherein the used correction amount is calculated before the acquired image data to correct the pixel value of at least one pixel in the sharing block of interest.

10. The image processing device according to claim 1, wherein the calculate the calculated correction amount is based on the offset component and the offset component that is calculated in a frame before that of the acquired image data.

11. The image processing device according to claim 1, wherein the used correction amount is calculated in a frame before that of the acquired image data to correct the pixel value of at least one pixel in the sharing block of interest in a current frame of the acquired image data.

12. The image processing device according to claim 1, wherein the correction amount corrects the pixel value of each pixel in the sharing block of interest by subtracting the correction amount from the pixel value of each pixel in the sharing block of interest.

13. The image processing device according to claim 1, wherein the calculation of the correction amount includes:
determining whether a luminous spot occurs in the sharing block of interest based on a difference between pixel values of two pixels of multiple pixels included within the sharing block of interest;
calculating the correction amount based on the calculated offset component; and
correcting the pixel value of the pixel in the sharing block of interest based on the calculated correction amount based on the calculated offset component, and wherein the calculation of the correction amount calculates the offset component or the correction amount for the sharing block of interest on a determination that no luminous spot occurs.

14. The image processing device according to claim 1, wherein
the acquisition of the image data acquires positional information about a defective block where a noise occurs in a pixel value due to the read circuit in the sharing blocks,
the detection of the offset component calculates the offset component for the sharing block contained in the positional information, and
the calculation of the a correction amount performs correction on the sharing block contained in the positional information based on the offset component.

15. An image processing method comprising:
acquiring image data generated by an imaging sensor including sharing blocks arranged two-dimensionally, each of the sharing blocks including multiple adjacent pixels configured to generate signals according to amounts of light received externally and one read circuit that is common to the multiple adjacent pixels and configured to read the signals as pixel values;
detecting an offset component of a pixel value occurring in the sharing block of interest based on the acquired image data and using pixel values of pixels in a sharing block of interest that is one of multiple sharing blocks and pixel values of pixels outside the sharing block of interest;
calculating a correction amount to correct a pixel value of at least one pixel in the sharing block of interest based on the offset component and using the correction amount to correct a pixel value of at least one pixel in the sharing block of interest; and
determining whether the sharing block of interest is a defective block where a noise occurs in a pixel value due to the read circuit based on the detected offset component;
wherein the calculating of the correction amount corrects the pixel value of at least one pixel in the sharing block of interest based on the detected offset component for the sharing block of interest that is determined as the defective block and, the correction amount is used to correct the pixel value of at least one pixel in the sharing block of interest.

16. A non-transitory computer-readable recording medium on which an executable program is recorded, the program instructing a processor of an image processing device to execute:
acquiring image data generated by an imaging sensor including sharing blocks arranged two-dimensionally, each of the sharing blocks including multiple adjacent pixels configured to generate signals according to amounts of light received externally and one read circuit that is common to the multiple adjacent pixels and configured to read the signals as pixel values;
detecting an offset component of a pixel value occurring in the sharing block of interest based on the acquired image data and using pixel values of pixels in a sharing block of interest that is one of multiple sharing blocks and pixel values of pixels outside the sharing block of interest; and
calculating a correction amount to correct a pixel value of at least one pixel in the sharing block of interest based on the offset component and using the correction amount to correct a pixel value of at least one pixel in the sharing block of interest; and
determine whether the sharing block of interest is a defective block where a noise occurs in a pixel value due to the read circuit based on the detected offset component;
wherein the calculation of the correction amount corrects the pixel value of at least one pixel in the sharing block of interest based on the detected offset component for the sharing block of interest that is determined as the defective block and, the correction amount is used to correct the pixel value of at least one pixel in the sharing block of interest.

* * * * *